United States Patent [19]

Wilson

[11] Patent Number: 4,816,732
[45] Date of Patent: Mar. 28, 1989

[54] ROBOTIC HAND FOR TRANSPORTING SEMICONDUCTOR WAFER CARRIERS

[75] Inventor: Charles F. Wilson, Denton, Tex.

[73] Assignee: SGS Thomson Microelectronics, Inc., Carrollton, Tex.

[21] Appl. No.: 86,278

[22] Filed: Aug. 17, 1987

[51] Int. Cl.⁴ .............................................. B25J 15/02
[52] U.S. Cl. .................................... 318/568; 414/730; 901/39
[58] Field of Search .................... 318/568; 364/513; 901/39, 45, 32, 30, 31, 33, 34, 35, 36, 38; 414/730

[56] References Cited

U.S. PATENT DOCUMENTS

| | | | |
|---|---|---|---|
| 3,145,333 | 8/1964 | Pardini et al. | 901/34 X |
| 4,316,329 | 2/1982 | Watson | 901/45 X |
| 4,423,998 | 1/1984 | Inaba et al. | 901/32 X |
| 4,479,673 | 10/1984 | Inaba et al. | 901/39 X |
| 4,632,623 | 12/1986 | Naumec | 901/45 X |
| 4,645,411 | 2/1987 | Madwed | 901/39 X |
| 4,672,741 | 6/1987 | Zafred et al. | 901/45 X |

FOREIGN PATENT DOCUMENTS 2581914 11/1986 France ................................. 901/39

OTHER PUBLICATIONS

Raibert, M. H. and J. J. Craig, "Hybrid Position/Force Control of Manipulators", Transactions of the ASMF, vol. 102, Jun. 1981, pp. 126-133.

Primary Examiner—Bentsu Ro
Attorney, Agent, or Firm—Roland Plottel

[57] ABSTRACT

A robotic element for lifting and moving semi-conductor wafer carriers and detecting collisions and correctness of engagement of the carrier to a robotic transport device. The element has a pair of spaced, parallel plates, a pair of rotary solenoids each fixed to one plate, and mounted between said plates and extending through the holes in said first plate for rotation therein. An engagement member is fixed to each of said rotary solenoids and extends outwardly from said first plate. The element also has a plurality of collision sensors and collision rebound means mounted between said plates.

11 Claims, 2 Drawing Sheets

ROBOTIC HAND FOR TRANSPORTING SEMICONDUCTOR WAFER CARRIERS

BACKGROUND OF THE INVENTION

The present invention relates to industrial robots, or more particularly to an industrial robot hand useful for the transportation of integrated circuit wafers. Typically, an industrial robot has an articulated mechanical arm, on the end of which is a "hand". The arm and hand movements are controlled by a servosystem which directs the hand to accomplish any desired pattern of movements. Through programming the robot is directed through various movements in a desired sequence. The use of a sensor input provides the robot with a knowledge of the changes to its environment, i.e. intrusions. Robot control algorithms may monitor sensor states to make decisions concerning the suitability of certain actions.

The manufacture of integrated circuits is becoming a highly automated process. Semiconductor wafers are processed with wafers held in carriers containing twenty-five wafers each. Processing the wafers requires handling and manipulation of the wafer carriers for transporting the wafers between process steps and loading wafer carriers into process machines. The process machines may produce corrosive fumes and liquids which may contact and attack any handling surface.

The wafers are extremely fragile and may be of very high monetary value. For this reason, handling techniques must be very reliable and done in a manner to protect the wafer carriers from being dropped, or forcefully crushed. When handling tasks are given to robots, the robot must be given the ability to sense and judge the safety of its load.

Wafer handling is becoming automated, that is, robots are being introduced to manipulate the carriers through the process steps. Robotic handling of wafer carriers is relatively new and suffers from the inability to determine whether the carrier grasp by the robot arm is successful and the inability to detect a collision during motion of wafer carriers. Detecting collisions during motion affords a peripheral benefit of improving the safety of people and adjacent equipment which may be damaged by a non-sensing robot.

This invention solves the foregoing problems of robotic wafer carrier handling by providing mechanical engagement of the wafer carriers in such a manner that a sensor is able to detect when the carrier position is correct for safe lifting of the wafer carrier, thus allowing the robot to decide whether movement is appropriate. The grasp mechanism is mounted to the robot arm in a manner enabling detection of a collision and halting further motion attempts. This prevents damage to the wafer carrier payload, robot mechanisms and the encountered object.

Typically, grippers available from robot arm manufacturers are successful in grasping a wafer carrier that is properly presented and which does not exhibit wear or distortion. This works well if the wafer carriers are accurately placed and the grasped carrier remains securely in the gripper.

In practice, manipulation may be unreliable, limited by carrier distortion and accuracy limitations of the machine delivering the wafer carrier. When delivery deviations occur beyond the acceptance limits of the gripper, it may either miss the wafer carrier entirely, causing the downstream process machine to deal with an error condition, or the gripper may make a partial grip, causing distortion or damage to the wafer carrier, crushed wafers or a dropped wafer carrier.

Similarly, wafer carriers which are worn or otherwise distorted from original design dimensions may cause mis-grip problems when a non-sensing gripper is utilized. As above, the results are distortion or damage to the wafer carrier when the carrier slips out during movements. The carrier is also subject to entanglement at the pick-up position and may encounter foreign objects in its path of motion. Also, mis-programming or hardware failure could cause a collision path to be followed. In these cases, the carrier may be wrenched from the gripper or the carrier may be crushed between the gripper and the obstacle.

Existing wafer carrier handling end effectors are deficient in having no qualitative feedback to the robot controller to allow judgment on the success of the grasp attempt as well as the security of the carrier after it is in the gripper and in motion. The invention provides workpiece sensing and lifting, as well as collision sensing. In the event of a misgrip, the invention provides error recovery in that the robot may be programmed to make minute movements and search for proper grip before giving up on the grip attempt.

SUMMARY OF THE INVENTION

The invention provides a robotic element for engagement with an article to be carried and for detecting collisions and correctness of engagement which comprises:

a. first and second spaced, substantially planar, parallel plates, said first plate having a pair of holes therethrough; and b. workpiece gripping means comprising:

i. a pair of grip driving means each fixed to said second plate plate, and mounted between said plates and extending through the holes in said first plate for motion therein; and ii. an engagement member fixed to each of said grip driving means and extending outwardly from said first plate; and c. a plurality of collision sensors mounted between said plates; and d. collision rebound means mounted between said plates.

In the preferred embodiment, the grip driving means are rotary solenoids.

DETAILED DESCRIPTION OF THE PREFERRED EMBODIMENT

Figure 1:
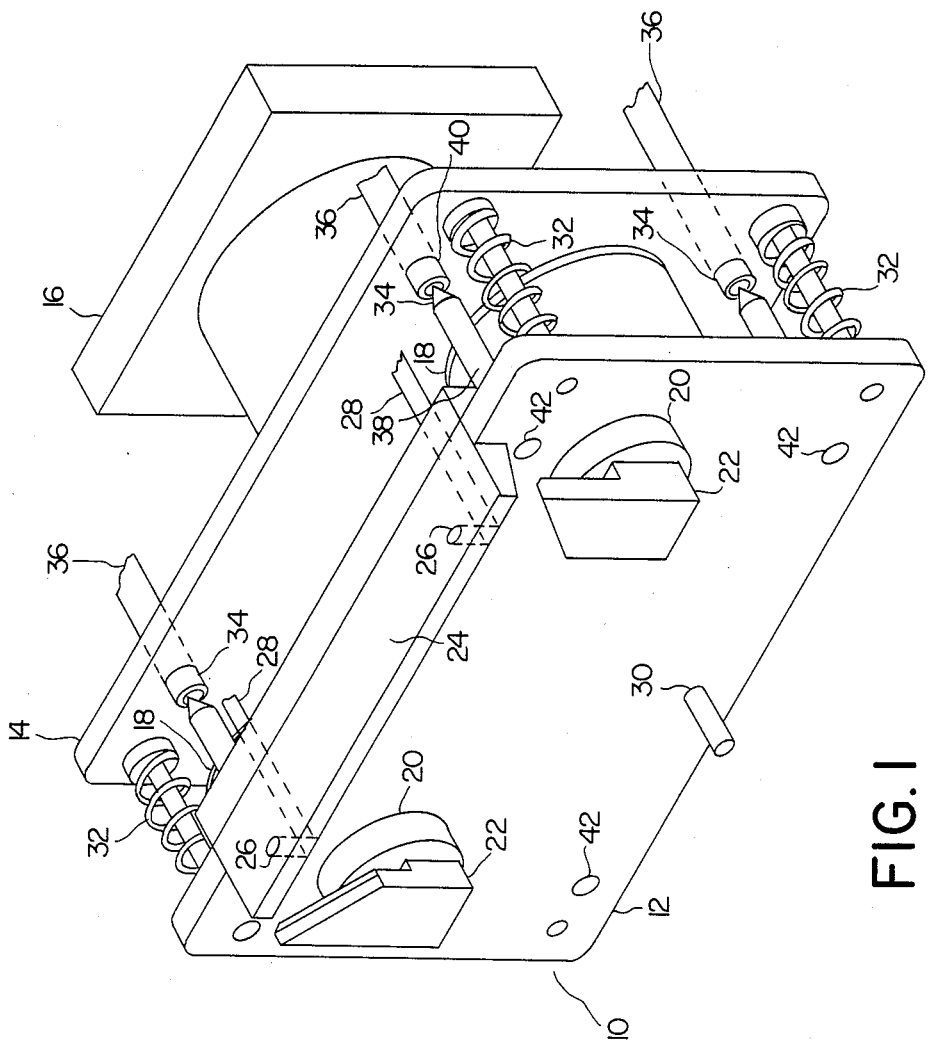
FIG. 1 shows a perspective view of a robotic element according to the invention.

As shown in FIG. 1, the invention provides a robotic element 10, which comprises front and rear parallel plates 12 and 14 respectively which are non-rigidly attached to robot arm 16. Disposed between plates 12 and 14 are rotary solenoids 18 which are fixed to the rear plate 14. The solenoids have frontwardly projecting parts 20, which are mounted in circular holes completely through the front plate so as to be able to rotate therewithin. Each of the frontwardly projecting solenoids parts 20 have cassette engagement arms 22 attached as shown. Upon generating the appropriate signal to the solenoid, parts 20 rotate the engagement arms 22 and thus lock into a wafer carrying cassette. The engagement arms preferably mate in a close tolerance fit with corresponding notches on the wafer carriers and urge the upper part of the cassette against mating lift structure 24. As mentioned, the solenoids are capable of rotary motion to either engage or disengage the cassette workpiece, however, in the most preferred embodiment, the solenoids are also capable of some degree of motion along the axis of rotation so as to be able to wiggle the cassette into exact engagement with parts 22 and 24. Although in the preferred embodiment the invention uses rotary solenoids as gripping means, other gripping means such as air cylinders, motors, spring levers, linear solenoids, vacuum cylinders and the like are within the scope of the invention to impart gripping motion.

Figure 2:
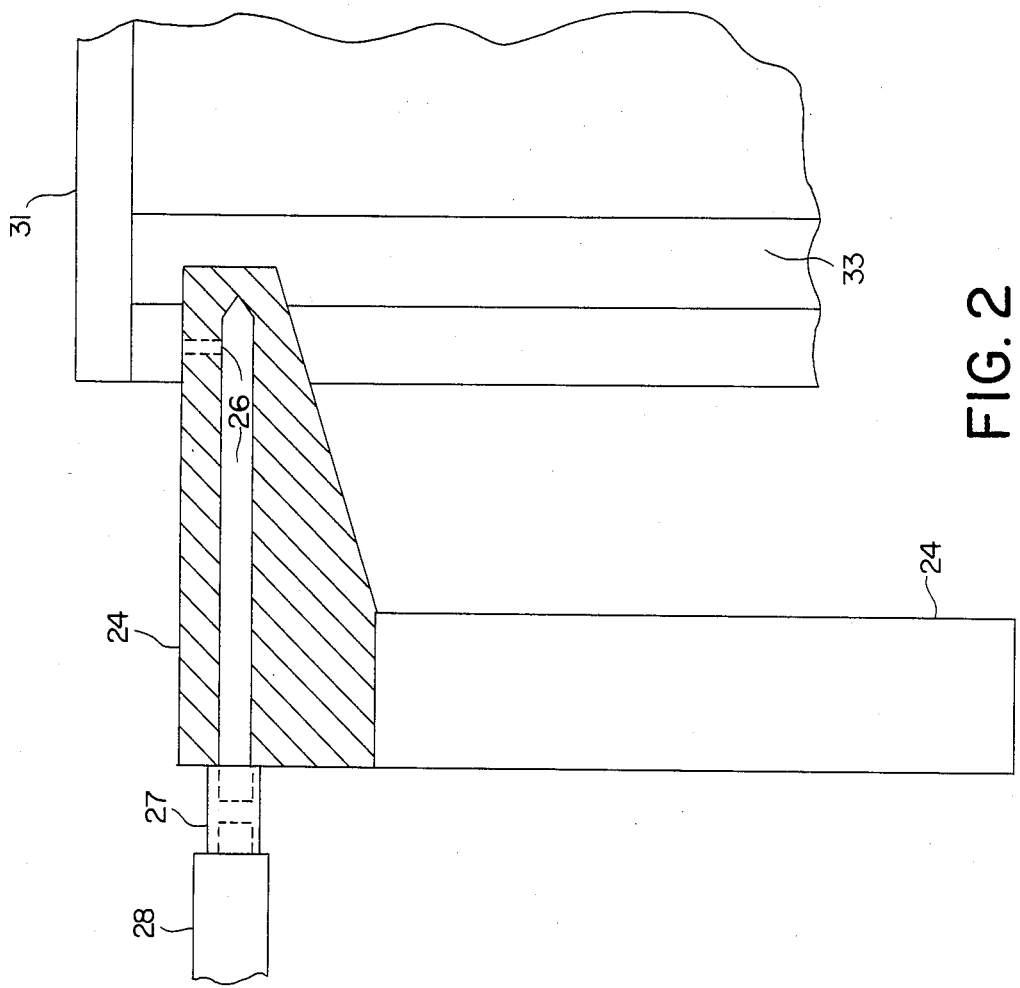
FIG. 2 shows a side sectional view of the lifting structure with its internal sensor.

As shown best in FIG. 2, in the preferred embodiment, the assembly has at least two sensor locations 26 which signal the correct placement of the workpiece cassette 31. Sensor signals are combined logically so that all the necessary conditions for a good grip are met before movement takes place. These contact points may be micro-switches which signal the correct seating of the cassette or as shown in the drawing, such may be pressure switches which are connected via hose fitting 27 to vacuum lines 28. When the cassette is correctly positioned, it will simultaneously block the flow of air through the sensors 26 and lines 28, thus signalling correct placement to the controller. If air flow is not simultaneously blocked, the solenoids are directed to move arms 22 until placement is correct, for example in cassette engagement recess 33. Otherwise, human intervention will be necessary. Optional post member 30 aids in placing cassette 33 by resisting any bending moment caused by parts 22 and 24 when the cassette is lifted.

As shown in FIG. 1, a series of rebound springs 32 is placed between the plates 12 and 14. These assist in cushioning the impact of the plates in the event the robotic element encounters an unexpected obstacle. These rebound springs surround optional guide bars as shown. Clearly other rebound means such as rubber cushions could be used as well. Also positioned between plates 12 and 14 are impact sensors 34 which detect any amount of impact force encountered which is in excess of the amount tolerated by design. Such impact sensors signal the robot mechanism to stop when an undersirable resistive or impact force is encountered. Such may be micro-switches or as in the embodiment shown in the drawing figures are vacuum lines 36 attached to pressure switches. When air flow in the lines is unobstructed, the element is available for movement. When the element hits an obstruction, rod member 38 is forced into a coupling engagement with receptor 40 and air flow is stopped in line 36. A signal is thereby transmitted to a switching mechanism upstream, not shown which stops the movement of the robot arm until the obstruction is cleared by human intervention. Rod members 38 may have their sensitivity adjusted at adjustment points 42. In practice, rods 38 are merely screws which are adjusted by turning a screw head at points 42 so their proximity to receptors 40 is changed as desired. Each of vacuum lines 28 and 36 may be connected to a common vacuum source without detrimental interference with sensing functions of all the sensors.

As mentioned before, the carrier grasp elements are not rigidly mounted on the end of a robot arm. In the event of a collision, the wafer carrier and grasp elements are deflected from their normal position with respect to the robot arm. This is set to occur with a small enough force that a detectable deflection occurs before the carrier is either damaged or wrenched out of a secure grip. The number and positioning of sensing points are selected to detect deflections caused by collisions, thereby signalling the robot control computer to immediately stop motion thereby eliminating the vast majority of situations where wafer damage would ordinarily occur. This includes a detection of collisions due to external forces applied from any of the three orthogonal directions. The non-rigid mounting of the hand assembly is designed so as not to deflect due to the weight and inertial forces caused by the carrier and wafers. The carrier remains in proper position with respect to the robot arm at all times.

In the preferred embodiment, the construction materials are selected such that they are resilient and not damaged by collisions. In addition, the materials should be able to withstand the corrosive chemicals typically used in semiconductor manufacture without deterioration.

It is of course to be understood that the herein described detailed description sets forth the proferred embodiment and such does not limit the invention as set forth in the appended claims.

What is claimed is:

1. A robotic element for engagement with a semiconductor carrier cassette to be carried and detecting collisions and correctness of engagement which comprises:
   a. first and second spaced, substantially planar, parallel plates, said first plate having a pair of holes therethrough; said first and second plates being spaced at a fixed distance from one another except during a collision; and
   b. workpiece gripping means comprising:
      i. a pair of grip driving means each fixed directly to said second plate, and mounted between said plates and extending through the holes in said first plate for free rotary motion therein without engagement with said first plate; and
      ii. a pair of workpiece engagement members, one of each member directly fixed to one of said grip driving means and extending outwardly from said first plate; and
   c. a plurality of collision sensors mounted between said plates; and
   d. a plurality of collision rebound means mounted between said plates which only engage in the event of a collision.

2. The element of claim 1 further comprising workpiece position sensing means.

3. The element of claim 1 wherein said rebound means comprises a plurality of springs capable of compression upon the collision of the robotic element and subsequent restoration of the plate spacing.

4. The element of claim 1 wherein said collision sensors comprise microswitches.

5. The element of claim 1 wherein said collision sensors comprise vacuum switches.

6. The element of claim 1 wherein said collision sensors comprise:
   a. a plurality of rods each mounted on only one of either of said plates, said rods positioned within said space perpendicular to both of said plates; and b. a mating receptacle for each of said rods mounted opposite said rods on the opposing plate and adapted to receive said rods therein; and c. signaling means adapted for the generation of a signal upon the penetration of said rods into said receptacles at a predetermined distance therein.

7. The element of claim 1 wherein said grip driving means are rotary solenoids.

8. The element of claim 7 wherein said rotary solenoids are capable of axial motion.

9. The element of claim 1 wherein said workpiece gripping means further comprises a lift member capable of clutching a workpiece in cooperation with said engagement members.

10. The elements of claim 1 wherein said grip driving means comprise components selected from the group consisting of air cylinders, motors, spring levers, linear solenoids, and vacuum cylinders.

11. A robotic element for engagement with an article to be carried and detecting collisions and correctness of engagement and which comprises:

a. first and second spaced, substantially planar, parallel plates, said first plate having a pair of holes therethrough; and b. workpiece gripping means comprising:
  i. a pair of rotary solenoids each capable of rotary and axial motion, fixed to said second plate, and mounted between said plates and extending through the holes in said first plate for motion therein; and
  ii. a pair of engagement members, one fixed to each of said rotary solenoids and extending outwardly from said first plate; and
  iii. a lift member capable of clutching a workpiece in cooperation with said engagement members; and
  iv. workpiece position sensing means on said lift member; and c. a plurality of collision sensors mounted between said plates; said collision sensors comprising vacuum switches; and d. collision rebound means mounted between said plates; and rebound means comprising a plurality of springs capable of compression upon the collision of the robotic element and subsequent restoration of the plate spacing.

* * * * *